United States Patent [19]
Yamaji et al.

[11] Patent Number: 5,398,748
[45] Date of Patent: Mar. 21, 1995

[54] HEAT PIPE CONNECTOR AND ELECTRONIC APPARATUS AND RADIATING FINS HAVING SUCH CONNECTOR

[75] Inventors: Hiroshi Yamaji; Tomoyuki Hongoh; Takashi Sato; Tsutomu Takahashi; Riichi Magome, all of Kawasaki, Japan

[73] Assignee: Fujitsu Limited, Kawasaki, Japan

[21] Appl. No.: 141,690

[22] Filed: Oct. 26, 1993

Related U.S. Application Data

[63] Continuation of Ser. No. 983,594, Feb. 4, 1993, abandoned.

[30] Foreign Application Priority Data

Jun. 5, 1991 [JP] Japan ................... 3-134425

[51] Int. Cl.[6] .................. F28D 15/02; H01L 23/24
[52] U.S. Cl. .................. 165/104.21; 165/80.4; 361/700
[58] Field of Search ............ 165/80.1-80.5, 165/185, 78, 104.21; 361/700

[56] References Cited

U.S. PATENT DOCUMENTS

| | | | |
|---|---|---|---|
| 2,879,977 | 3/1959 | Trought | 165/80.3 |
| 3,366,171 | 1/1968 | Scharli | 165/185 |
| 3,412,231 | 11/1968 | McElligott | 165/78 |
| 3,874,443 | 4/1975 | Bayer | 165/80.3 |
| 4,660,132 | 4/1987 | Basler et al. | 165/78 |
| 4,799,541 | 1/1989 | Buna et al. | 165/78 |

FOREIGN PATENT DOCUMENTS

| | | |
|---|---|---|
| 1823 | 1/1978 | Japan . |
| 47587 | 10/1983 | Japan . |
| 226966 | 11/1985 | Japan . |
| 70447 | 3/1988 | Japan . |
| 451694 | 3/1990 | Japan . |
| 155296 | 6/1990 | Japan . |
| 45694 | 12/1990 | Japan . |

OTHER PUBLICATIONS

Patent Abstracts of Japan, vol. 14, No. 411 (E-973) 5 Sep. 1990 & JP-A-02 155 296 (Fujitsu Ltd) 14 Jun. 1990 abstract.

Patent Abstracts of Japan, vol. 11, No. 224 (E-525) 21 Jul. 1987 & JP-A-62 042 550 (Fujitsu Ltd) 24 Feb. 1987 abstract.

*Primary Examiner*—John K. Ford
*Attorney, Agent, or Firm*—Staas & Halsey

[57] ABSTRACT

A heat pipe connector includes a housing having a hole shaped like a quadrangular pyramid with a large opening and a small opening. A plurality of clamp pieces are combined into a body that can be fitted into the hole shaped like a quadrangular pyramid. A heat pipe insertion opening, into which a heat pipe is inserted, is formed in the center of the combined pieces. Springs energize each clamp piece toward the small opening of the hole shaped like a quadrangular pyramid. The heat pipe is inserted into the heat pipe insertion opening from the side of the small opening of the housing hole shaped like a quadrangular pyramid. It is configured such that a spring force; of the springs as well as lateral surfaces of the hole shaped like a quadrangular pyramid apply a force to the clamp pieces to clamp the heat pipe.

12 Claims, 19 Drawing Sheets

HEAT PIPE CONNECTOR AND ELECTRONIC APPARATUS AND RADIATING FINS HAVING SUCH CONNECTOR

This application is a continuation of application Ser. No. 07/983,594, filed Feb. 4, 1993, now abandoned.

FIELD OF THE INVENTION

The present invention pertains to a heat pipe connector as well as to an electronic apparatus and radiating fins having such a connector, and more particularly to a heat pipe connector for connecting a heat pipe to a radiating portion or to a heat-generating portion as well as to an electronic apparatus and radiating fins having such a connector.

BACKGROUND OF THE INVENTION

Among methods for conducting heat generated by electronic parts to radiating fins is a method using a heat pipe. In this method, it is necessary for the heat pipe to be connected to the electronic parts and to the radiating fins. Generally, the electronic parts are mounted by inserting them in the form of a printed wiring board assembly from the front of a shelf of an electronic apparatus. For this reason, it is desirable that the heat pipe be connected in such a manner as to allow the mounting of the printed wiring board assembly.

FIG. 1 illustrates an example of a conventional electronic apparatus. In the figure, a plurality of printed wiring board assemblies 8 are inserted and mounted in a shelf 1a of an electronic apparatus 1. The printed wiring board assembly 8 comprises: a printed board 2; an electronic part 3 and radiating fins 4 both provided on the printed board; and a heat pipe 5.

As shown enlarged in FIG. 2, the heat pipe 5 is fixed on the electronic part 3 and the radiating fins 4 by means of respective hardwares 6, 7. This construction, in which the heat pipe 5 is fixed on the electronic part 3 and the radiating fins 4, has a disadvantage in that the only feasible configuration for the radiating fins 4 is the one in which the radiating fins are fitted to the printed board 2, and the configuration where the radiating fins 4 are fitted to the shelf 1a is not being achievable. The configuration in which the radiating fins 4 are fitted to the printed board 2 is unfavorable in terms of radiating efficiency because the radiating fins 4 are housed inside the shelf 1a. Another problem is that the printed wiring board assemblies 8 become heavy when the radiating fins 4 are mounted thereto.

SUMMARY OF THE INVENTION

Accordingly, a general object of the present invention is to provide a novel and useful heat pipe connector as well as an electronic apparatus and radiating fins having such a connector, in which the above-described disadvantages are eliminated.

Another object of the present invention is to provide a heat pipe connector comprising: a housing having a hole shaped like a quadrangular pyramid with a large opening and a small opening; a plurality of clamp pieces combined into a body that is fitted into the hole shaped like a quadrangular pyramid, a heat pipe insertion opening, into which a heat pipe is inserted, being formed in the center of the combined pieces; and springs for urging each clamp piece toward the small opening of the hole shaped like a quadrangular pyramid; the heat pipe connector being configured such that, When the heat pipe is inserted into the heat pipe insertion opening from the side of the small opening of the housing hole shaped like a quadrangular pyramid in such a manner that the heat pipe presses the clamp pieces against pressure from the springs, the clamp pieces are pressed against lateral surfaces of the hole shaped like a quadrangular pyramid by a spring force of the springs so that the heat pipe may be clamped.

According to the present invention, an end of the heat pipe thus inserted can be connected to a radiating portion and/or a heat-generating portion, thus providing excellent heat convection in the connection portion.

Still another object of the present invention is to provide an electronic apparatus comprising: a shelf having openings; at least one printed wiring board assembly mounted inside the shelf by inserting the assembly through an opening; a back cover for covering the opening of the shelf; a heat pipe for connecting the printed wiring board assembly to the back cover; and at least one heat pipe connector detachably connected to an end of the heat pipe, The heat pipe connector being fixed to either the printed wiring board assembly or the back cover, or both thereof, and comprising: a housing having a hole shaped like a quadrangular pyramid with a large opening and a small opening; a plurality of clamp pieces combined into a body that can be fitted into the hole shaped like a quadrangular pyramid, a heat pipe insertion opening, into which the heat pipe is inserted, being formed in the center of the combined pieces; and springs for urging each clamp piece toward the small opening of the hole shaped like a quadrangular pyramid, and The electronic apparatus being configured such that when the heat pipe is inserted into the heat pipe insertion opening from the side of the small opening of the housing hole shaped like a quadrangular pyramid in such a manner that the heat pipe presses the clamp pieces against pressure from the springs, the clamp pieces are pressed against lateral surfaces of the hole shaped like a quadrangular pyramid by a spring force of the springs so that the heat pipe may be clamped.

According to the present invention, it is possible to radiate heat of the heat-generating portion on the printed board from the back cover when the printed wiring board assembly is mounted inside the shelf by inserting the composite through the front of the shelf. Hence, the radiating efficiency of the present invention is better than that of the conventional art. Another advantage of the present invention is that electromagnetic shielding behavior is improved because there is no need to provide a vent hole on a front cover of the electronic apparatus. Furthermore, since it is not necessary to provide radiating fins on the printed board composite, the printed board composite can be made smaller and lighter than that in the conventional art, and the number of electronic parts that can be fitted on the printed board is larger than the number that can be conventionally fitted.

It is also found that a configuration in which the heat pipe is not fixed on the printed wiring board assembly makes it easy to handle the printed wiring board assembly. Similarly, a configuration in which the heat pipe is not fixed to the back cover facilitates easy handling of the back cover.

One more object of the present invention is to provide an electronic apparatus comprising: a shelf; a heat pipe having one end connected to a heat-generating portion inside the shelf and another end projected from the shelf; and radiating fins having a heat pipe connector detachably connected to the above-mentioned other end of the heat pipe, The heat pipe connector comprising: a housing having a hole shaped like a quadrangular pyramid with a large opening and a small opening; a plurality of clamp pieces combined into a body that can be fitted into the hole shaped like a quadrangular pyramid, a heat pipe insertion opening, into which the heat pipe is inserted, being formed in the center of the combined pieces; and springs for urging each clamp piece toward the small opening of the hole shaped like a quadrangular pyramid, and The electronic apparatus being configured such that when the heat pipe is inserted into the heat pipe insertion opening from the side of the small opening of the housing hole shaped like a quadrangular pyramid in such a manner that the heat pipe presses the clamp pieces against pressure from the springs, the clamp pieces are pressed against lateral surfaces of the hole shaped like a quadrangular pyramid by the spring force of the springs so that the heat pipe may be clamped.

According to the present invention, radiating efficiency of an electronic apparatus, especially that of a table-top type, can be improved.

Still another object of the present invention is to provide radiating fins comprising: a plurality of fins; and a heat pipe connector fixed to the fins and configured to be detachably connected to one end of the heat pipe connector, The heat pipe connector comprising: a housing having a hole shaped like a quadrangular pyramid with a large opening and a small opening; a plurality of clamp pieces combined into a body that can be fitted into the hole shaped like a quadrangular pyramid, a heat pipe insertion opening, into which a heat pipe is inserted, being formed in the center of the combined pieces; and springs for urging each clamp piece toward the small opening of the hole shaped like a quadrangular pyramid, and The radiating fins being configured such that when the heat pipe is inserted into the heat pipe insertion opening from the side of the small opening of the housing hole shaped like a quadrangular pyramid in such a manner that the heat pipe presses the clamp pieces against pressure from the springs, the clamp pieces are pressed against lateral surfaces of the hole shaped like a quadrangular pyramid by the spring force of the springs so that the heat pipe may be clamped.

According to the present invention, the radiating efficiency of an electronic apparatus can be improved by radiating fins having a simple configuration.

Other objects and further features of the present invention will become apparent from the following detailed description when read in conjunction with the accompanying drawings.

DESCRIPTION OF THE PREFERRED EMBODIMENTS

First, an embodiment of the heat pipe connector according to the present invention will be described with reference to FIGS. 3-12.

Figure 1:
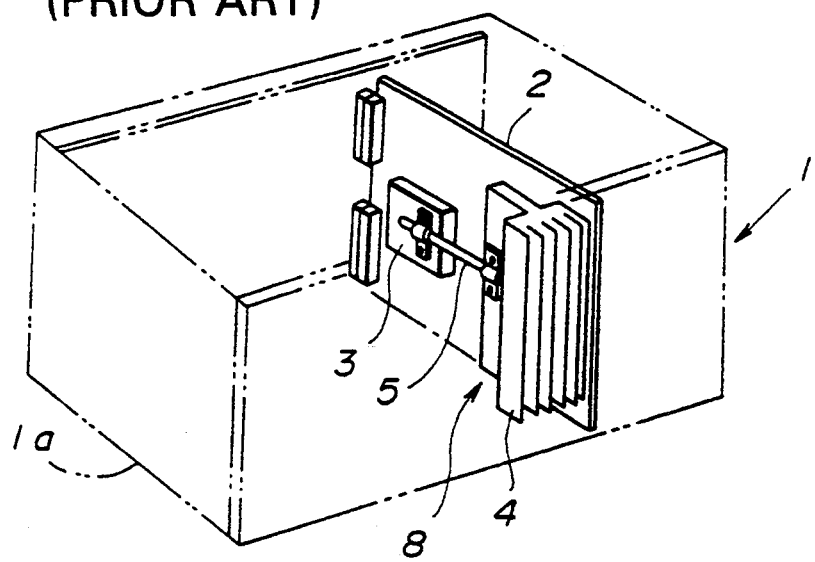
FIG. 1 is a perspective view illustrating an example of a conventional electronic apparatus.
Figure 2:
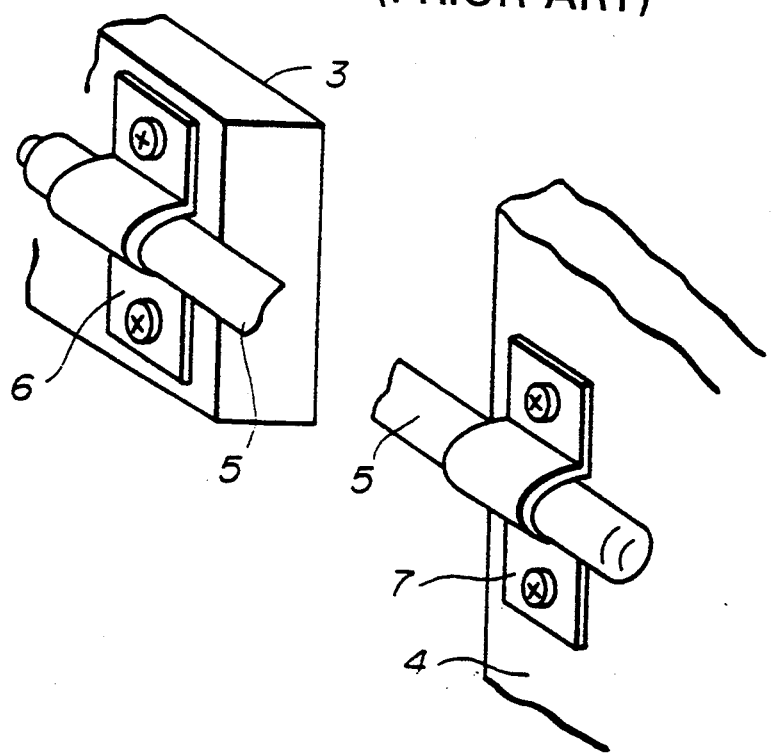
FIG. 2 is an enlarged perspective view illustrating the connection portion of the heat pipe of FIG. 1.
Figure 3:
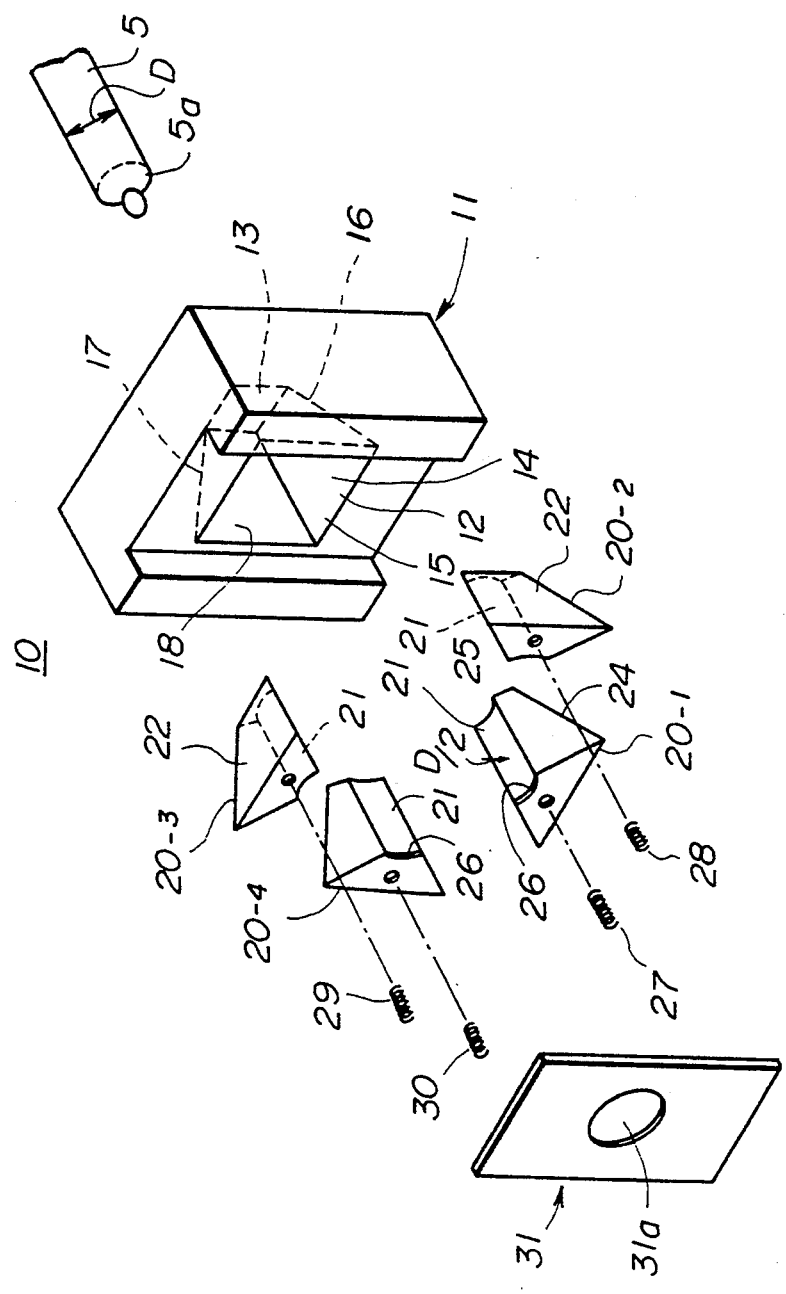
FIG. 3 is an exploded perspective view illustrating an embodiment of the heat pipe connector according to the present invention.
Figure 4:
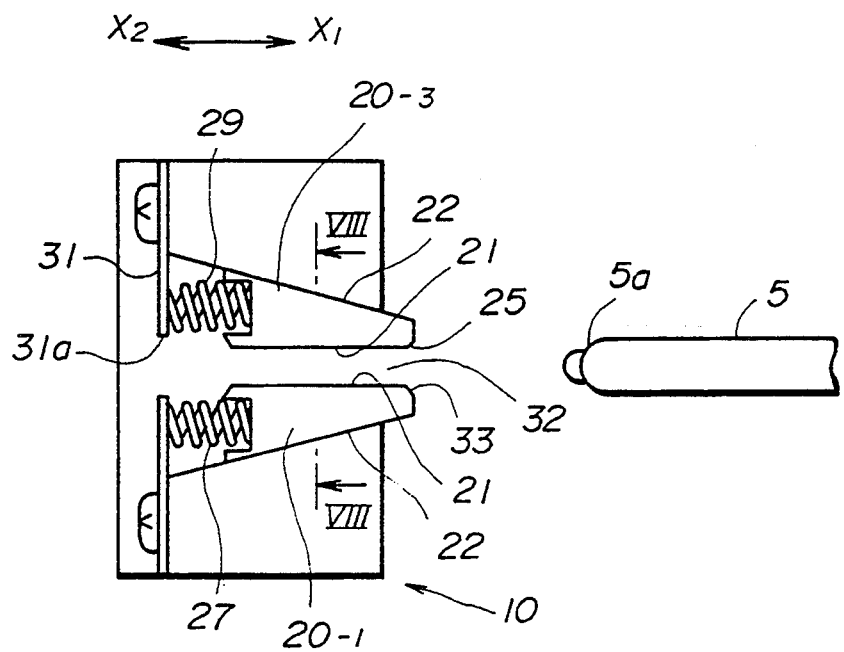
FIG. 4 is a cross-sectional view of the heat pipe connector of FIG. 3.
Figure 5:
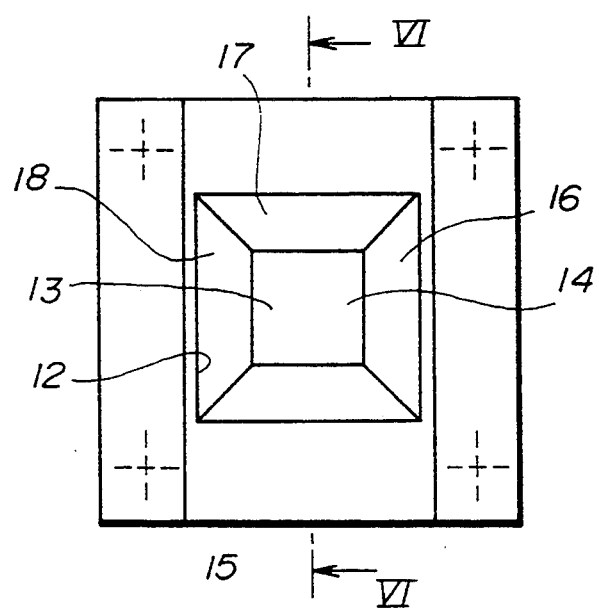
FIG. 5 is a back view of the housing of FIG. 3 viewed from the large opening therein.
Figure 6:
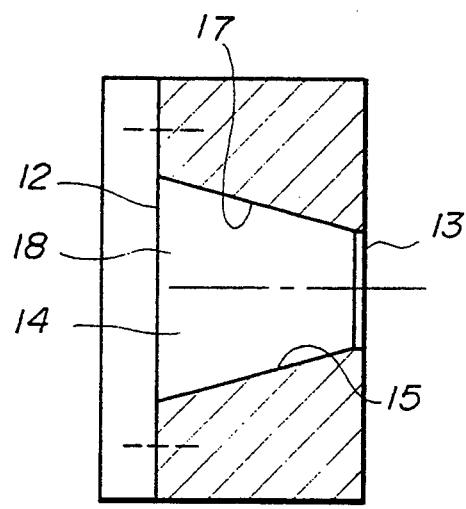
FIG. 6 is a cross-sectional view taken along the line VI—VI of FIG. 5.

FIGS. 3 and 4 illustrate the heat pipe connector according to the present invention. In the figures, a heat pipe connector 10 comprises an aluminum housing 11A and a hole 14 shaped like a quadrangular pyramid with a large opening 12 and a small opening 13 is formed in the housing 11, as shown in FIGS. 5 and 6. Lateral surfaces 15–18 of the hole 14 are inclined planes.

Figure 7:
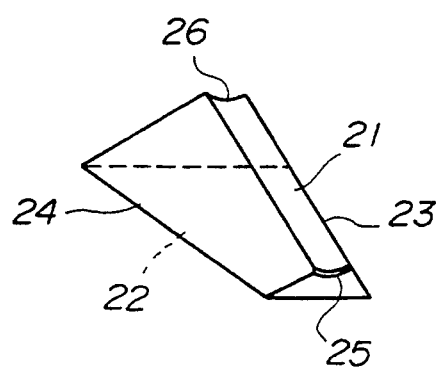
FIG. 7 is a perspective view illustrating a clamp piece of FIG. 3.
Figure 8:
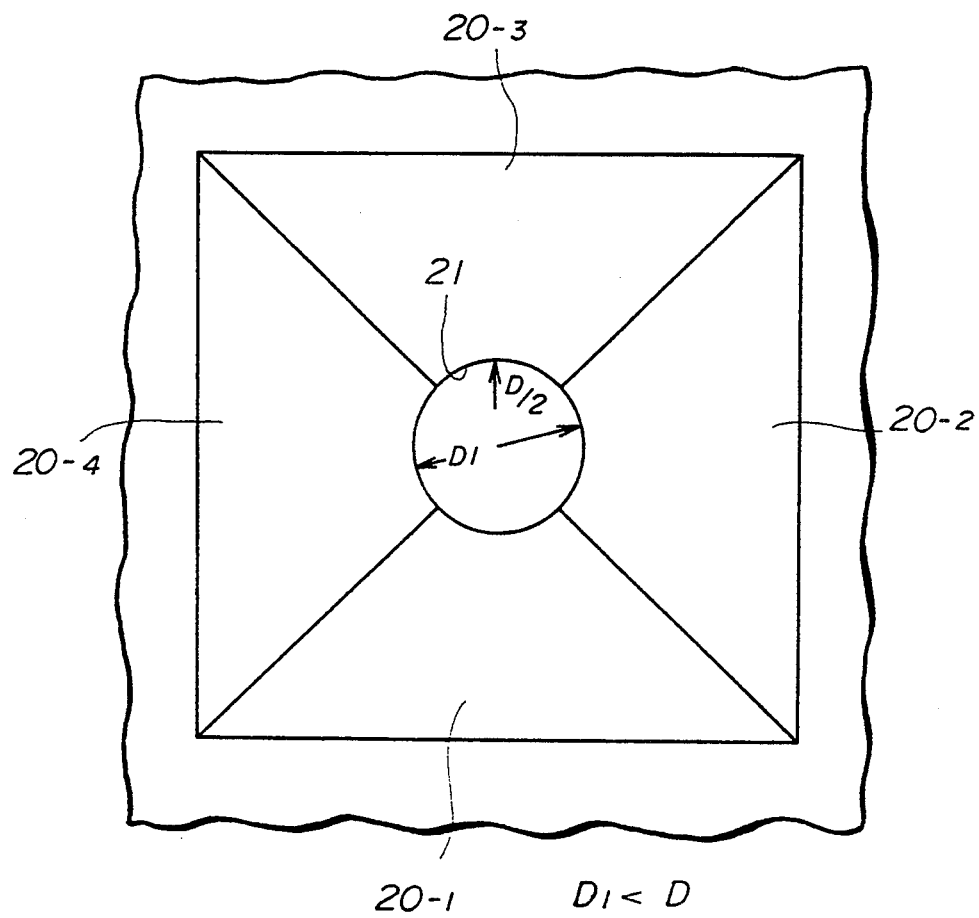
FIG. 8 is a cross-sectional view taken along the line VIII—VIII of FIG. 4.

Clamp pieces $20_{-1}$–$20_{-4}$ are combined to form a quadrangular pyramid body that corresponds to the hole 14, and a hole is drilled in the center of the combined pieces, which hole has a diameter corresponding to a diameter D of a heat pipe 5. This body is severed diagonally crosswise, the severed surfaces thereof being ground to a predetermined degree, and the resultant clamp pieces having the same shape. As shown in FIGS. 7 and 8, each of the clamp pieces $20_{-1}$–$20_{-4}$ has a circular section 21 having a radius of D/2 on one side thereof, a flat surface 22 corresponding to one of the lateral surfaces 15–18 on the other side thereof, and slopes 23, 24 on both lateral sides thereof. Both longitudinal ends of the circular section 21 are chamfered to create slopes 25, 26.

Figure 9:
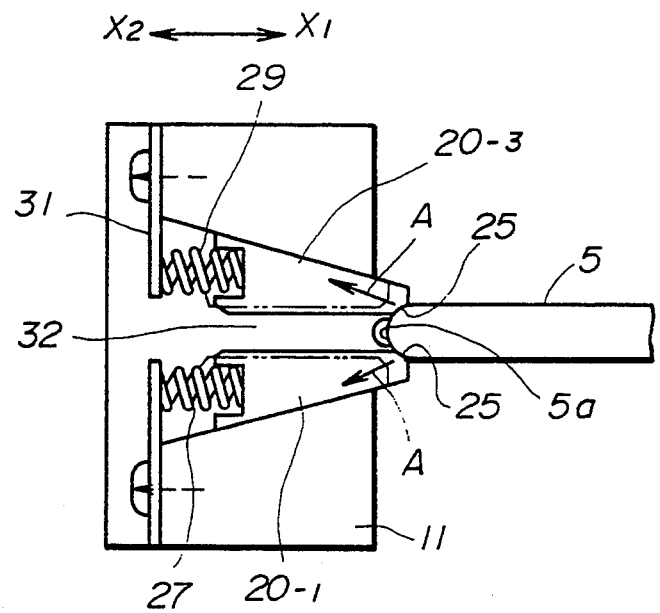
FIG. 9 illustrates how the heat pipe is connected to the connector.

The clamp pieces $20_{-1}$–$20_{-4}$ are fitted into the hole 14 of the housing 11, and are independently urged by means of compression coil springs 27–30 in the $X_1$ direction shown by an arrow in FIG. 9. Spring seat plates 31, having, in the center, a hole 31a which accepts a heat pipe 5, are screwed to the back of the housing 11 in such a manner as to block the large opening 12. Each of the clamp pieces $20_{-1}$–$20_{-4}$ is independently urged by means of the respective springs 27–30 in the $X_1$ direction shown by the arrow, and, as shown in FIG. 4, partially projects from the small opening 13. As a result, the clamp pieces are fitted into the hole 14 in a converging manner so that they are drawn to one another toward their respective narrower ends.

As shown in FIG. 8, a diameter $D_1$ of a heat pipe insertion opening 32 formed by the circular section 21 of each of the clamp pieces $20_{-1}$–$20_{-4}$ is such that $D_1 < D$. The heat pipe insertion opening 32 is somewhat circular when viewed from top. The mouth of the hole 32, near the small opening 13 thereof, is turned into a taper portion 33 due to the chamfer slope 25 provided thereon.

A description will be given now of how the heat pipe 5 is connected to the connector 10.

The heat pipe 5 is connected to the connector 10 when the heat pipe 5 is thrust in the direction $X_2$ shown by an arrow and forced into the hole 32 from the side of the small opening 13 of the housing 11. An end 5a of the heat pipe 5 is generally semi-spherical. As shown in FIG. 9, the semi-spherical end 5a of the heat pipe 5 engages with the taper portion 33, and therefore comes in contact with the chamfered slope 25 and presses the same. As indicated by an arrow A, forces parallel to the slopes 15–18 of the hole 14 are exerted on the clamp pieces $20_{-1}$–$20_{-4}$, respectively.

Figure 10:
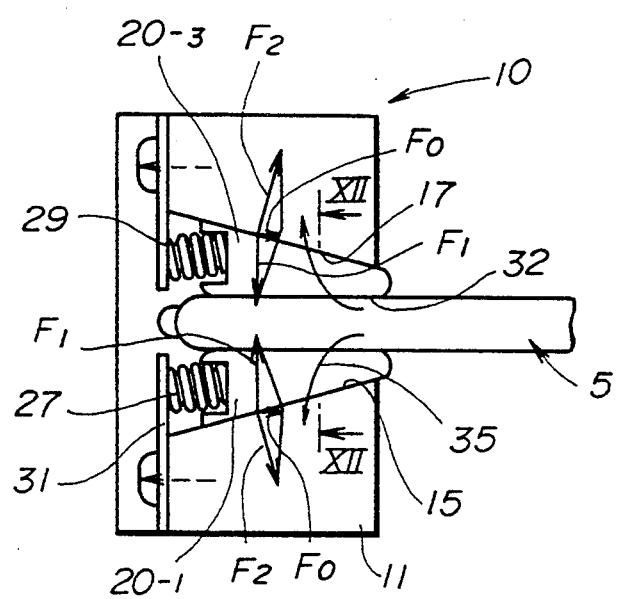
FIG. 10 illustrates the state in which the heat pipe is connected to the heat pipe connector.

In consequence of this, as shown by an alternating long and two short dashes line, the clamp pieces $20_{-1}$–$20_{-4}$ are driven in the $X_2$ direction shown by the arrow by the forces parallel to the slopes 15–18 of the hole 14, at the same time as the springs 27–30 are respectively compressed, with the result that the hole 32 becomes larger. This way, the heat pipe 5 can be inserted in the hole 32, and connected to the connector 10, as shown in FIGS. 10 and 11.

A description will next be given of the connection state.

Figure 11:
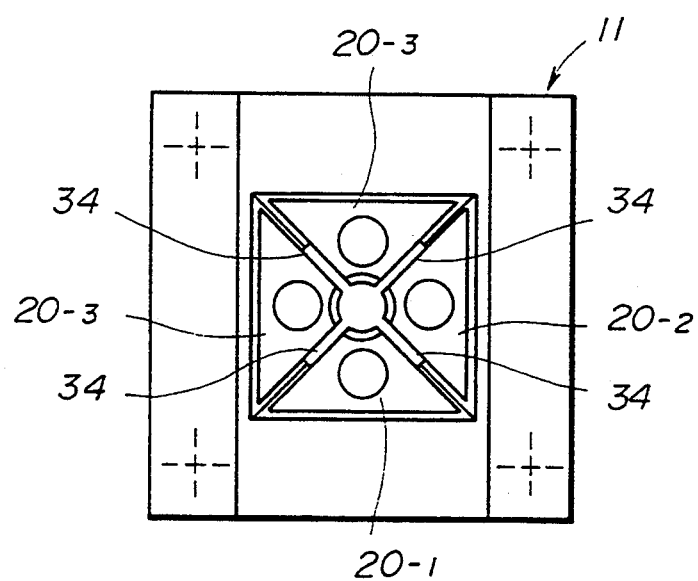
FIG. 11 is a back view of FIG. 10 viewed from the large opening in the housing, with a spring seat being removed.

Because the clamp pieces $20_{-1}$–$20_{-4}$ are displaced in the $X_2$ direction shown by the arrow, gaps 34 are created between the slopes 23 and 24 of the adjacent the clamp pieces $20_{-1}$–$20_{-4}$ as shown in FIG. 11, and thus the clamps $20_{-1}$–$20_{-4}$ become separate and independent. The clamp pieces $20_{-1}$–$20_{-4}$ thus separated are independently urged by a spring force $F_0$ of the springs 27–30 in the $X_1$ direction shown by the arrow. The clamp pieces $20_{-1}$–$20_{-4}$ are guided by the slopes 15–18 that are in contact with the surface 22. Therefore, a force $F_1$ is generated and exerted in a direction along which the clamp pieces $20_{-1}$–$20_{-4}$ are drawn to one another toward their narrower ends, in other words, in such a manner that the hole 32 shrinks in the radial direction, resulting in the clamp pieces $20_{-1}$–$20_{-4}$ clamping the heat pipe 5, and the circular sections 21 being pressed against the entire circumferential surface of the heat pipe 5.

Since the radius of the circular section 21 is configured to be D/2, all of the surfaces of the circular sections 21 are in tight contact with the outer circumference of the heat pipe 5. The clamp pieces $20_{-1}$–$20_{-4}$ are pressed, by a force $F_2$, against the lateral surfaces 15–18 corresponding to the respective flat surfaces 22 by means of the springs 27–30. Since the lateral surfaces 15–18 are flat, all of the flat surfaces 22 are placed in tight contact with the respective lateral surfaces 15–18. It is thus ensured that sufficiently large contact areas are provided between the heat pipe 5 and each of the clamp pieces $20_{-1}$–$20_{-4}$, and between the housing 11 and each of the clamp pieces $20_{-1}$–$20_{-4}$.

As a result of this, heat from the heat pipe 5 is conducted to the clamp pieces $20_{-1}$–$20_{-4}$ efficiently, as shown by an arrow 35, and also from the clamp pieces $20_{-1}$–$20_{-4}$ to the housing 11 efficiently.

A description will now be given of how the heat pipe is disconnected.

In FIG. 10, the heat pipe 5 is pulled forcefully in the $X_1$ direction. This causes the heat pipe 5 to be drawn out of the hole 32 to be disconnected from the connector 10.

Figure 11A:
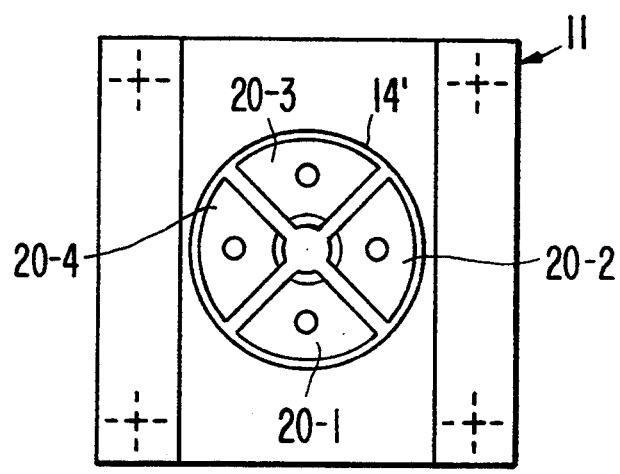
FIG. 11A is a back view similar to FIG. 11 showing another embodiment of the invention in which the hole is in the form of a circular cone and the clamp pieces have an arcuate configuration.
Figure 12:
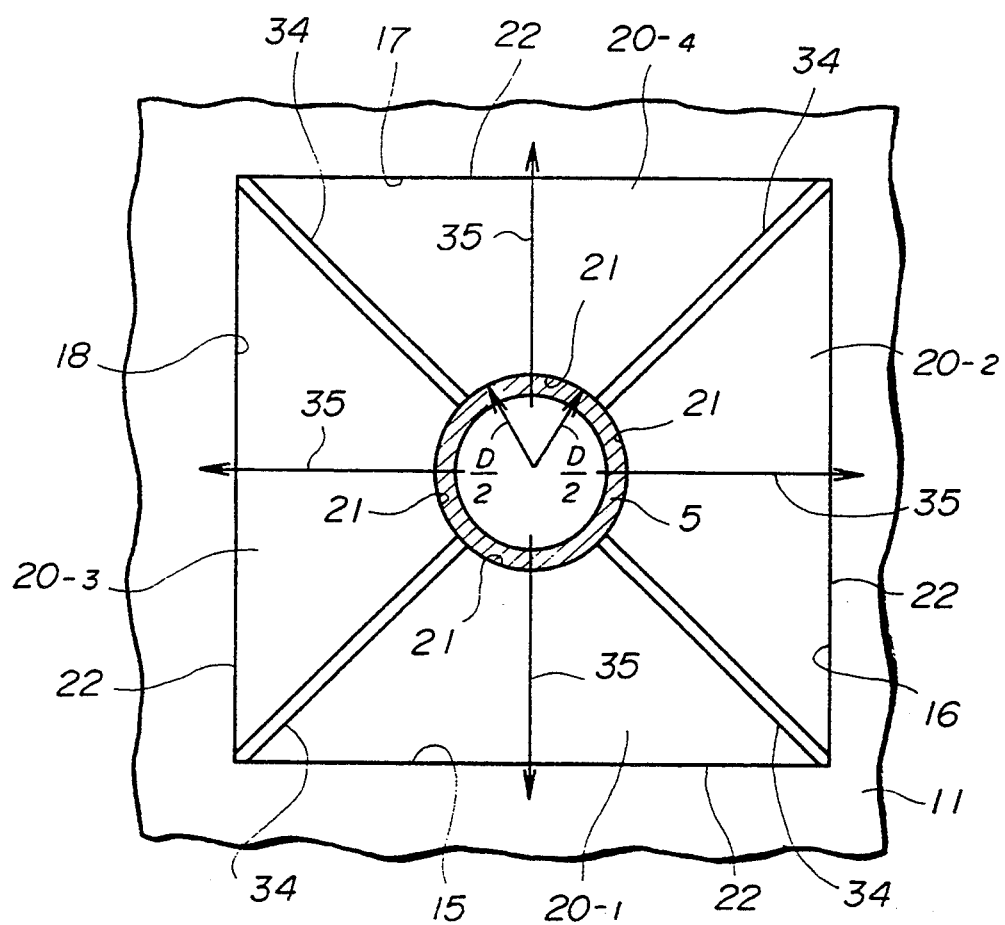
FIG. 12 is a cross-sectional view taken along the line of XII—XII of FIG. 10.

In an alternative configuration the hole in the housing 11 is shaped like a triangular pyramid, into which hole three clamp pieces are fitted. Also, the hole in the housing 11 can be shaped like a circular 14, into which hole a plurality of clamp pieces $20_1$–$20_4$ are fitted as shown in FIG. 11A. That is, the shape of the hole in the housing 11 and the number of clamp pieces are not limited to those in the described embodiment. The only requirement regarding the number of clamp pieces is that there be more than two.

A description will next be given of embodiments of the electronic apparatus of the present invention to which apparatus the heat pipe connector 10 of the above configuration is applied.

Figure 13:
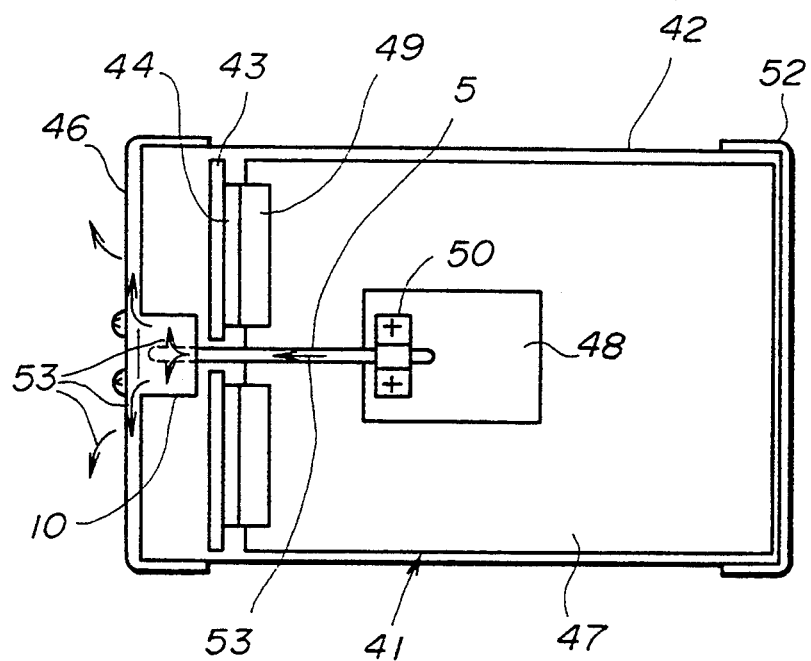
FIG. 13 illustrates the first embodiment of the electronic apparatus according to the present invention.
Figure 14:
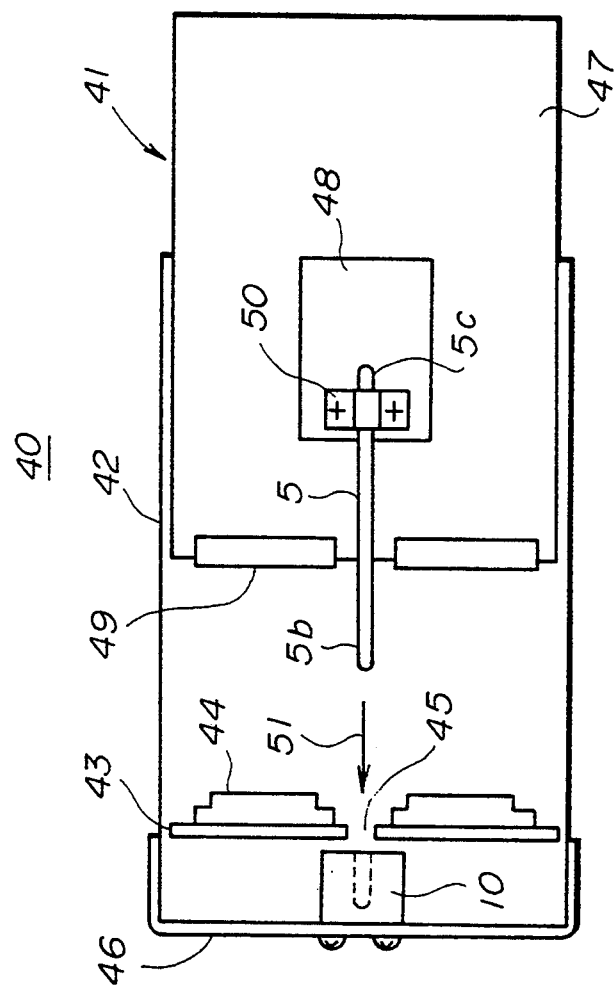
FIG. 14 illustrates the state of the first embodiment of the electronic apparatus in which state the printed board composite is mounted.

FIGS. 13 and 14 illustrate the first embodiment of the electronic apparatus of the present invention. In this embodiment, the above-described heat pipe connector 10 is used. In the figures, an electronic apparatus 40 has a configuration such that a printed wiring board assembly 41 is mounted in a shelf 42 by inserting the composite therein. A connector 44 is fixed to a back board 43. The back board 43 has a hole 45 in the center and is fitted near the back end of the shelf 42. A back cover 46 for covering an opening of the shelf 42 is made of aluminum and assembled with the heat pipe connector 10.

The printed wiring board assembly 41 is configured such that heat-generating electronic parts 48 such as transistors, LSIs, or circuit modules are mounted on a printed board 47; the front end of the printed board along the insertion direction is provided with a connector 49; and the heat pipe 5 is fixed, at one end 5c, on the electronic parts 48 by means of hardware 50, with the other end 5b projecting away from the connector 49. The printed wiring board assembly 41 does not have any radiating fins, and so it is smaller and lighter than the conventional board, making it easy to handle. In the space created by removing the radiating fins, other electronic parts are mounted; therefore a larger number of electronic parts are mounted on the printed board 41 than on the conventional board.

As shown in FIG. 14, when the printed board 41 is inserted inside the shelf 42 in the direction 51 shown by an arrow until it reaches the terminal position, the connector 49 is coupled to the connector 44, as shown in FIG. 13 and the heat pipe 5 is connected to the heat pipe connector 10 through a hole 45 as described above. As indicated by arrows 53, heat generated by the electronic parts 48 flows through the electronic parts 48→the heat pipe 5→the heat pipe connector 10→the back cover 46→the surrounding air, and is radiated outside from the back cover 46.

A front cover 52 blocks the front of the shelf 42. There is no vent hole provided on the front cover 52, and therefore the electronic apparatus 40 has better electromagnetic shielding behavior than the conventional apparatus.

Figure 15:
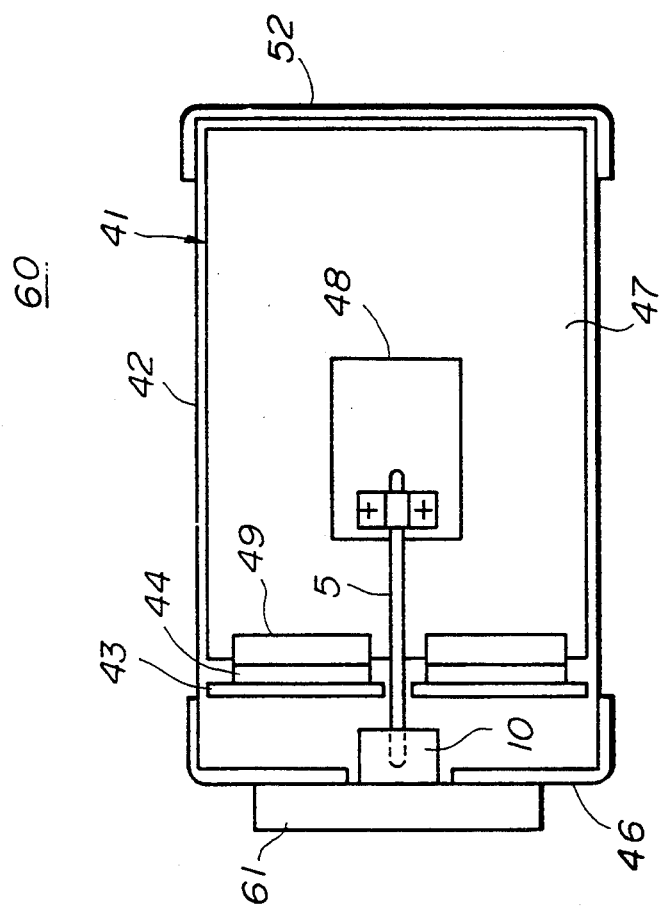
FIG. 15 illustrates the second embodiment of the electronic apparatus of the present invention.

FIG. 15 illustrates the second embodiment of the electronic apparatus according to the present invention. In the figure, an electronic apparatus 60 is configured such that radiating fins 61 are provided on the outer surface of the back cover 46, and the heat pipe connector 10 on the inside of the back cover 46 is fixed on the radiating fins 61. Other configurations are the same as those of the electronic apparatus 40.

The electronic apparatus 60 has better radiating efficiency than the electronic apparatus 40 of FIG. 13 because of the radiating fins 61.

Figure 16:
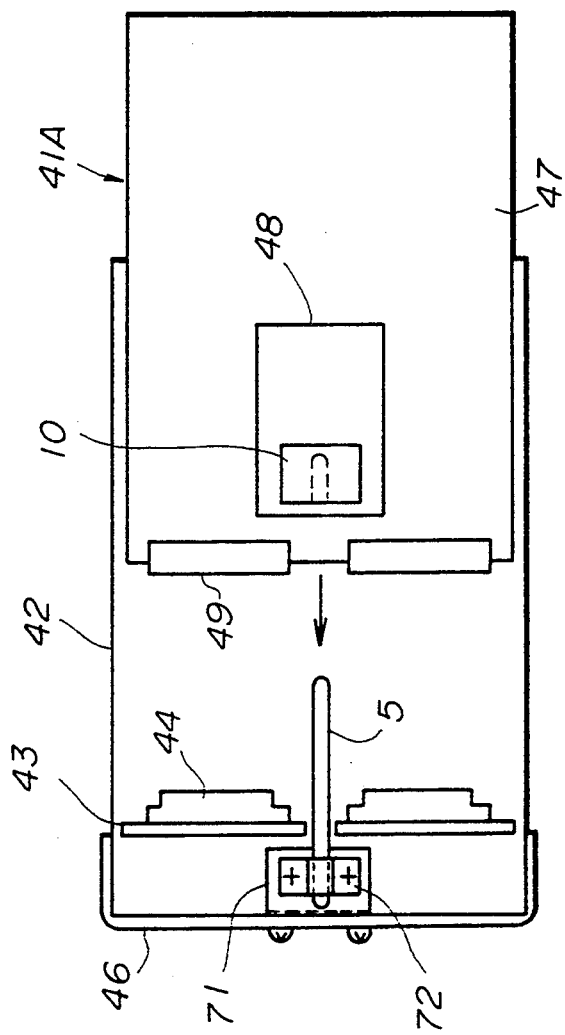
FIG. 16 illustrates the third embodiment of the electronic apparatus of the present invention.

FIG. 16 illustrates the third embodiment of the electronic apparatus of the present invention. In an electronic apparatus 70 in the figure, the heat pipe 5 is fixed on a bracket 71 on the back cover 46 by means of hardware 72, and projects toward the interior of the shelf 42. The heat pipe connector 10 is mounted on the electronic parts 48 in a printed wiring board assembly 41A. When the printed wiring board assembly 41A is mounted in the shelf, the heat pipe connector 10 is connected to the heat pipe 5.

Figure 17:
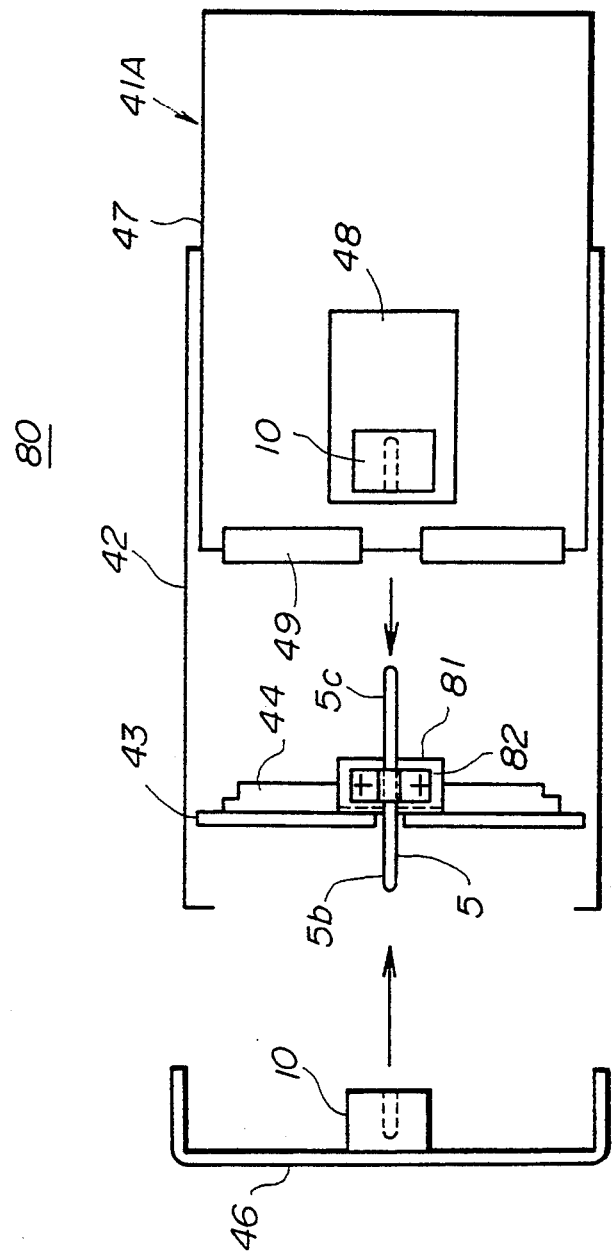
FIG. 17 illustrates the fourth embodiment of the electronic apparatus of the present invention.

FIG. 17 illustrates the fourth embodiment of the electronic apparatus of the present invention. In an electronic apparatus 80 in the figure, the center of the heat pipe 5 is fixed on a bracket 81 on the back board 43 by means of hardware 82. By fitting the back cover 46 on the heat pipe connector, the heat pipe connector 10 on the back cover 46 is connected to the end 5b of the heat pipe 5. By mounting the printed board composite 41A in the shelf, the heat pipe connector 10 on the electronic parts 48 is connected to the end 5c of the heat pipe 5.

In the above-mentioned electronic apparatuses 70 and 80, the heat pipe is not provided in the printed wiring board assembly 41A, thus facilitating easy handling and packing of the printed wiring board assembly 41A. Further, in the electronic apparatus 80, this configuration of the back cover 46 makes packing the apparatus easy.

An embodiment of the radiating fins of the present invention will be now described with reference to FIGS. 18-21.

Figure 18:
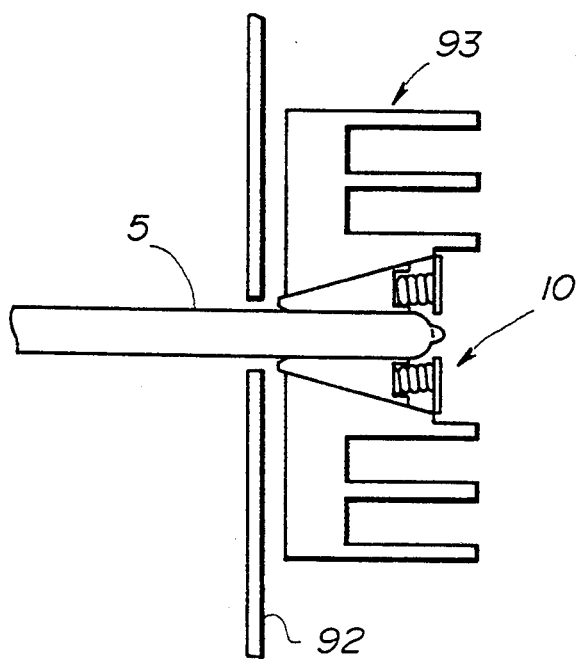
FIG. 18 is a cross-sectional view illustrating an embodiment of the radiating fins according to the present invention.

FIG. 18 illustrates an embodiment of the radiating fins. In the figure, radiating fins 93 are configured such that the above-mentioned heat pipe connector 10 is built thereinto. This figure shows a state in which the radiating fins 93 are connected to the heat pipe 5 of a table-top electronic apparatus 90 shown in FIG. 19.

Figure 19:
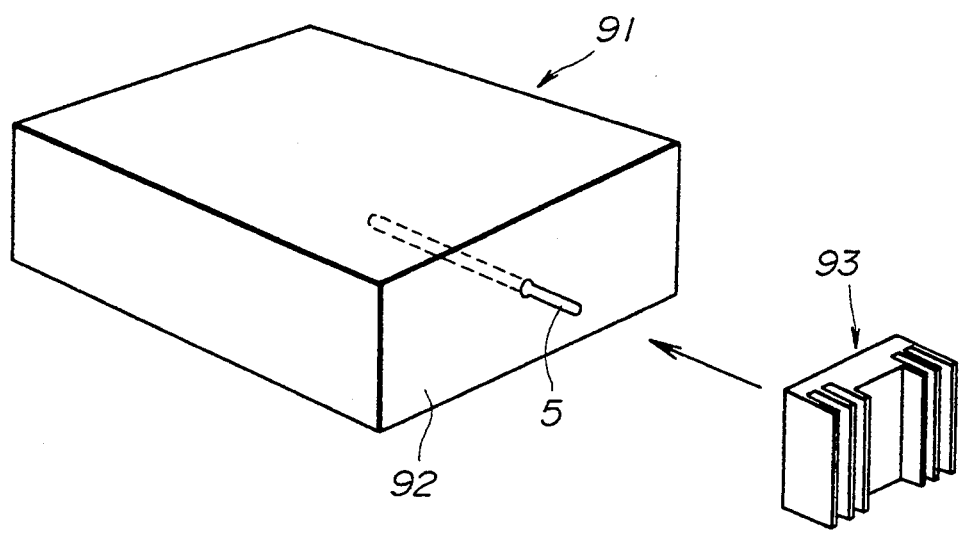
FIG. 19 is a perspective view of the electronic apparatus to which the radiating fins of FIG. 18 can be applied.
Figure 20:
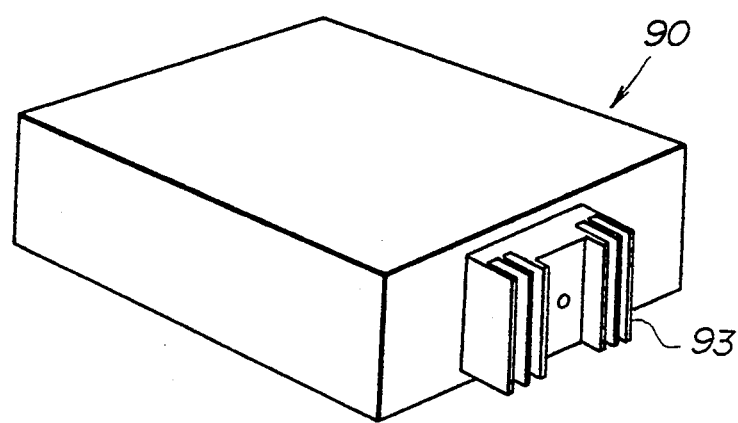
FIG. 20 is a perspective view illustrating the electronic apparatus of FIG. 19 placed sideways and used in that condition.

The electronic apparatus 90 is provided with the heat pipe 5 which projects from the back 92 of the shelf 91, as shown in FIG. 19. Accordingly, when the radiating fins 93 are connected to the heat pipe 5 of the electronic apparatus 90 placed sideways, a state shown in FIG. 20 is manifested.

Figure 21:
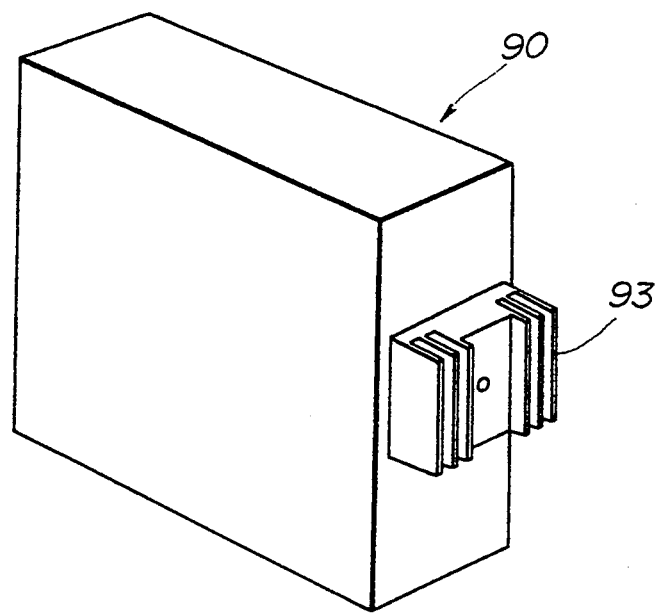
FIG. 21 is a perspective view illustrating the electronic apparatus of FIG. 19 placed on end and used in that condition.

When the electronic apparatus 90 is placed on end, it is desirable, in consideration of the convection effect, that the radiating fins 93 be rotated so that the fins extend vertically, as shown in FIG. 21.

A description will now be given of a tool useful for removing the heat pipe connector 10 from the heat pipe 5, and of usage thereof, with reference to FIGS. 22-24.

Figure 22:
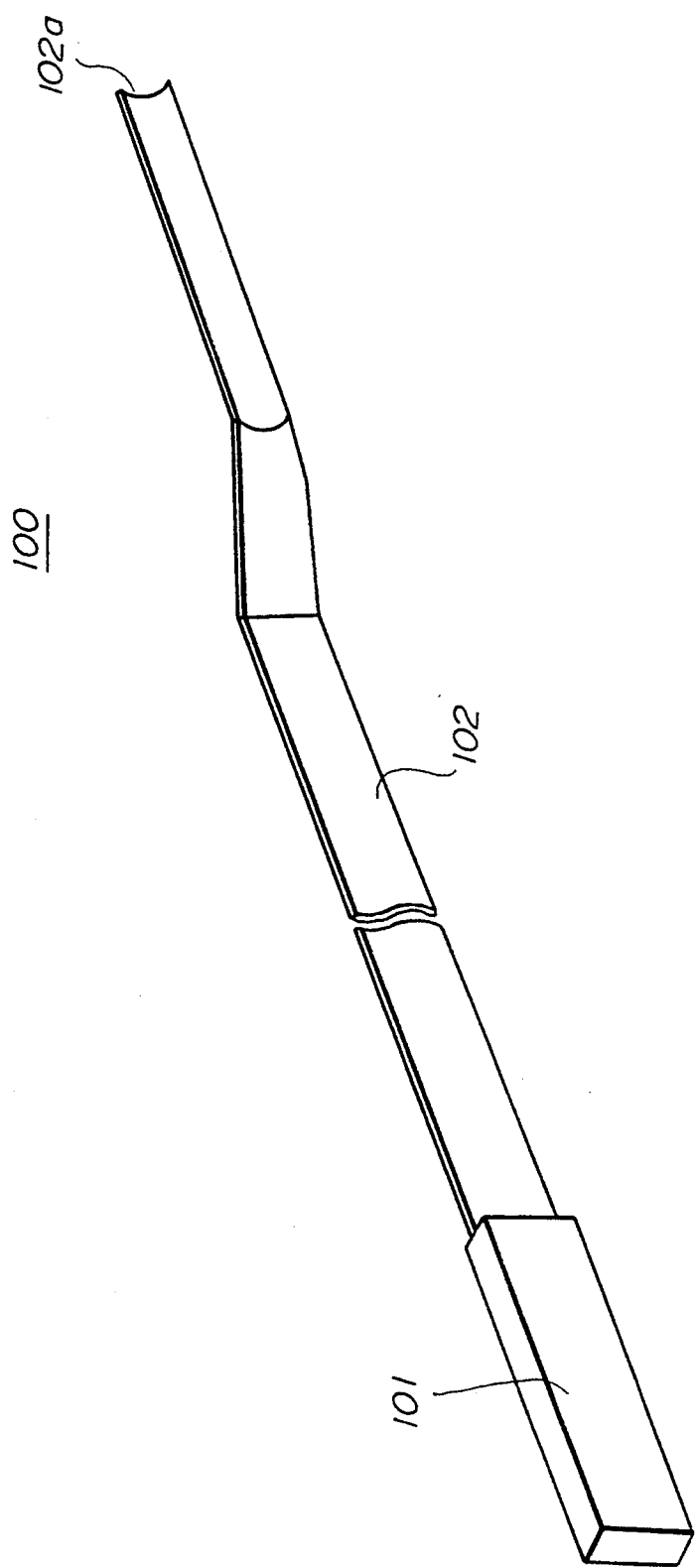
FIG. 22 is a perspective view illustrating the tool used for removing the heat pipe connector from the heat pipe.

FIG. 22 illustrates a tool 100. The tool 100 comprises: a handle 101 and an arm 102. The curvature of an end 102a of the arm 102 is configured to be a little larger than that of the heat pipe 5.

Figure 23:
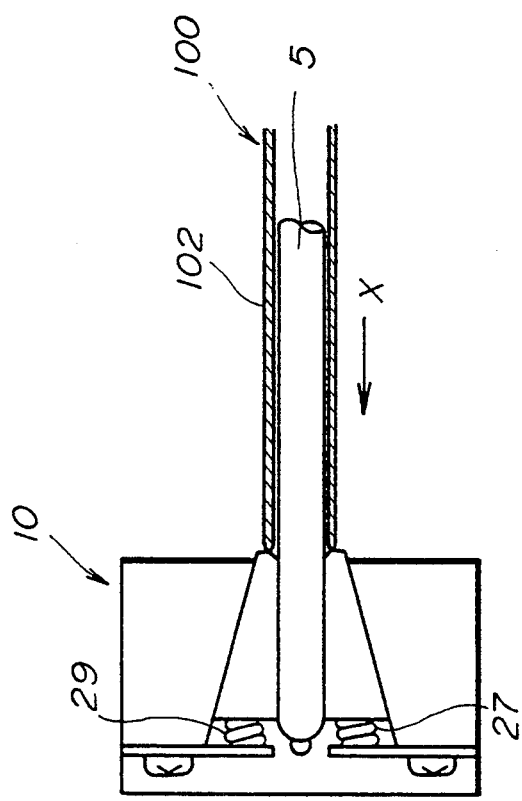
FIG. 23 illustrates a removal operation of the heat pipe connector using the tool.
Figure 24:
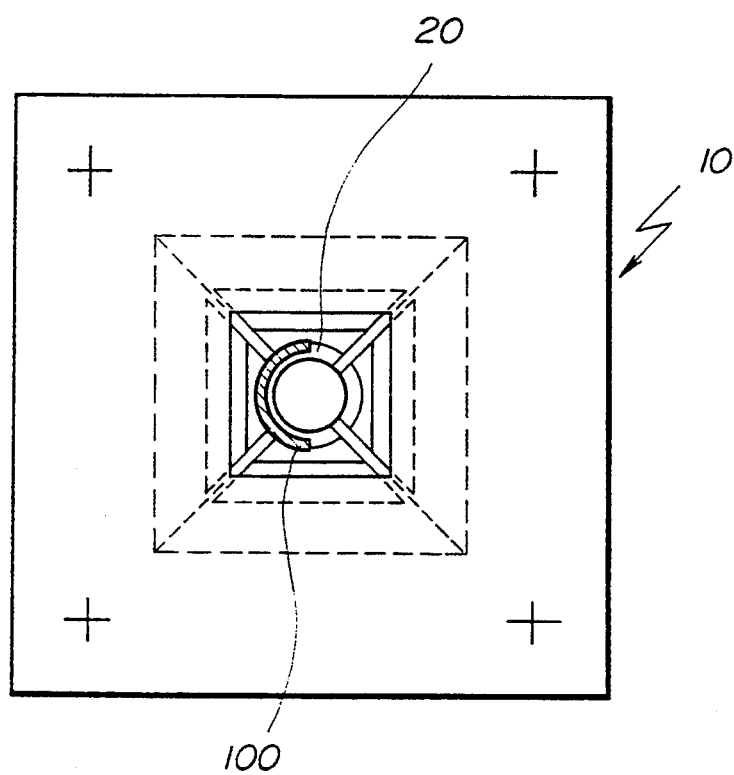
FIG. 24 illustrates how the edge of the tool and the clamp piece of the heat pipe connector contact each other.

To remove the heat pipe connector 10 from the heat pipe 5, the arm 102 of the tool 100 is made to slide along the heat pipe 5 in the X direction in FIG. 23 until the end 102a is in contact with some of the clamp pieces 20. As shown in FIG. 24, three clamp pieces 20 are thrust by the end 102a of the arm 102 in the X direction. This results in the three clamp pieces 20 being moved in the X direction against the corresponding three springs from among the springs 27-30 (of which only 27 and 29 are shown in the figure), with the result that the heat pipe insertion opening 32 is slightly enlarged. As a result, the heat pipe connector 10 can be easily removed from the heat pipe 5.

In order for the tool to be able to remove the heat pipe connector from the heat pipe, it is required that the number of clamp pieces 20 thrust by the end 102a of the arm 102 be more than half the number of total clamp pieces. When there are four clamp pieces as in the above case, three of the clamp pieces 20 need to be thrust in the X direction.

In the above embodiments, the clamp pieces of the heat pipe connector are formed, for example, of aluminum or copper. It is recommended that lubricating oil be coated on the surface of the clamp pieces, which surface forms the heat pipe insertion opening and/or on the outer surface of the heat pipe.

The present invention is not limited to the above embodiments, and various other changes and modifications may be made within the scope of the present invention.

As has been described, the heat pipe connector according to the present invention allows one end of the heat pipe inserted thereinto to be connected to the radiating and/or heat-generating portion as well as guaranteeing excellent heat convection in the connection portion. According to the electronic apparatus of the present invention, the printed board composites are made smaller and lighter than those of the conventional art while at the same time radiating efficiency and electromagnetic shielding behavior are improved. Moreover, the radiating efficiency of the electronic apparatus of the present invention can be improved by the radiating fins having a simple configuration, which is very useful.

We claim:

1. A heat pipe connector comprising:
   a housing having a large opening and a small opening which connect to form a hole which is defined by one or a plurality of side surfaces and has a shape, at least generally, of a selected one of a cone or pyramid;
   a plurality of clamp pieces which, when combined, have a shape corresponding to the shape of said hole, said clamp pieces being combined and fit within said hole and forming a heat pipe insertion opening at a central part thereof, said heat pipe insertion opening being adapted to receive a heat pipe; and a plurality of springs for urging said clamp pieces towards the small opening of said hole by spring forces, each of said clamp pieces pushing against the side surfaces which define said hole as a result of the spring forces and clamping the heat pipe when the heat pipe is inserted into said heat pipe insertion opening from the small opening of said housing so as to push said clamp pieces against the spring forces of said springs.

2. The heat pipe connector as claimed in claim 1, wherein said clamp pieces have curved surfaces, said curved surfaces making close contact with an outer peripheral surface of the heat pipe which is inserted into said heat pipe insertion opening.

3. An electronic apparatus comprising:
a housing having openings;
at least one printed wiring board assembly inserted through one of the openings in said housing and mounted in said housing;
a back cover for covering another of the openings in said housing;
a heat pipe connecting said printed wiring board assembly and said back cover; and
at least one heat pipe connector detachably connected to one end of said heat pipe,
said heat pipe connector being fixed to at least one of said printed wiring board assembly and said back cover,
said heat pipe connector comprising:
a housing having a large opening and a small opening which connect to form a hole which is defined by one or a plurality of side surfaces and has a shape, at least generally, of a selected one of a cone or pyramid;
a plurality of clamp pieces which, when combined, have a shape corresponding to the shape of said hole, said clamp pieces being combined and fit within said hole and forming a heat pipe insertion opening at a central part thereof, said heat pipe insertion opening being adapted to receive a heat pipe; and
a plurality of springs for urging said clamp pieces towards the small opening of said hole by spring forces,
each of said clamp pieces pushing against the side surfaces which define said hole as a result of the spring forces and clamping the heat pipe when the heat pipe is inserted into said heat pipe insertion opening from the small opening of said housing so as to push said clamp pieces against the spring forces of said springs.

4. The electronic apparatus as claimed in claim 3, wherein said heat pipe connector is fixed to said back cover and the other end of said heat pipe is fixed to said printed wiring board assembly.

5. The electronic apparatus as claimed in claim 4, wherein said back cover includes radiating fins.

6. The electronic apparatus as claimed in claim 3, wherein said heat pipe connector is fixed to said printed wiring board and the other end of said heat pipe assembly is fixed to said back cover.

7. The electronic apparatus as claimed in claim 3, wherein said heat pipe connector is fixed to said printed wiring board assembly and said back cover.

8. The electronic apparatus as claimed in claim 7, which further comprises a back board which is inserted between said printed wiring board assembly and said back cover within said housing, a central portion of said heat pipe being fixed to said back board.

9. An electronic apparatus comprising:
a housing;
a heat pipe having one end connected to a heat generating portion within said housing and another end projecting from said housing; and
a radiator fin structure having a heat pipe connector which is detachably connected to the other end of said heat pipe,
said heat pipe connector comprising:
a housing having a large opening and a small opening which connect to form a hole which is defined by one or a plurality of side surfaces and has a shape, at least generally, of a selected one of a cone or pyramid;
a plurality of clamp pieces which, when combined, have a shape corresponding to the shape of said hole, said clamp pieces being combined and fit within said hole and forming a heat pipe insertion opening at a central part thereof, said heat pipe insertion opening being adapted to receive a heat pipe; and
a plurality of springs for urging said clamp pieces towards the small opening of said hole by spring forces,
each of said clamp pieces pushing against the side surfaces which define said hole as a result of the spring forces and clamping the heat pipe when the heat pipe is inserted into said heat pipe insertion opening from the small opening of said housing so as to push said clamp pieces against the spring forces of said springs.

10. The electronic apparatus as claimed in claim 9, wherein said radiator fin structure is rotatably connected with respect to said heat pipe.

11. A radiator fin structure comprising:
a fin member having a plurality of fins; and
a heat pipe connector fixed to said fin member and detachably connected to one end of said fin member and detachably connected to one of a heat pipe,
said heat pipe connector comprising:
a housing having a large opening and a small opening which connect to form a hole which is defined by one or a plurality of side surfaces and has a shape, at least generally, of a selected one of a cone or pyramid;
a plurality of clamp pieces which, when combined, have a shape corresponding to the shape of said hole, said clamp pieces being combined and fit within said hole and forming a heat pipe insertion opening at a central part thereof, said heat pipe insertion opening being adapted to receive a heat pipe; and
a plurality of springs for urging said clamp pieces toward the small opening of said hole by spring forces,
each of said clamp pieces pushing against the side surfaces which define said hole as a result of the spring forces and clamping the heat pipe when the heat pipe is inserted into said heat pipe insertion opening from the small opening of said housing so as to push said clamp pieces against the spring forces of said springs.

12. The radiator fin structure as claimed in claim 11, wherein said fin member is rotatably connected to said heat pipe.

* * * * *

UNITED STATES PATENT AND TRADEMARK OFFICE
CERTIFICATE OF CORRECTION

PATENT NO. : 5,398,748
DATED : March 21, 1995
INVENTOR(S) : Hiroshi YAMAJI et al.

It is certified that error appears in the above-indentified patent and that said Letters Patent is hereby corrected as shown below:

```
Column 6, line 34, change "14," to --cone,--;

line 50, change "compos-" to

--assembly--;

line 51, change "ite" to

--deleted--.
```

Signed and Sealed this

Twentieth Day of June, 1995

*Attest:*

BRUCE LEHMAN

*Attesting Officer*     *Commissioner of Patents and Trademarks*